(12) United States Patent
Hikichi et al.

(10) Patent No.: US 11,624,789 B2
(45) Date of Patent: *Apr. 11, 2023

(54) SEMICONDUCTOR DEVICE

(71) Applicant: ABLIC Inc., Tokyo (JP)

(72) Inventors: Tomoki Hikichi, Tokyo (JP); Kentaro Fukai, Tokyo (JP)

(73) Assignee: ABLIC INC., Chiba (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/459,260

(22) Filed: Aug. 27, 2021

(65) Prior Publication Data
US 2021/0389386 A1 Dec. 16, 2021

Related U.S. Application Data

(63) Continuation of application No. 16/800,399, filed on Feb. 25, 2020, now Pat. No. 11,131,721.

(30) Foreign Application Priority Data

Mar. 15, 2019 (JP) .............................. JP2019-048069

(51) Int. Cl.
*G01R 33/00* (2006.01)
*H03F 1/22* (2006.01)
(Continued)

(52) U.S. Cl.
CPC ......... *G01R 33/0029* (2013.01); *G01D 21/02* (2013.01); *G01R 33/07* (2013.01); *H03F 1/22* (2013.01); *H03F 3/45183* (2013.01); *H03F 2200/228* (2013.01); *H03F 2203/45138* (2013.01)

(58) Field of Classification Search
CPC .... G01R 33/0029; G01R 33/07; G01D 21/02; H03F 1/22; H03F 3/45183; H03F 2200/228; H03F 2203/45138
See application file for complete search history.

(56) References Cited

U.S. PATENT DOCUMENTS 4,868,902 A    9/1989 Sato
11,131,721 B2 *  9/2021 Hikichi .................. G01D 3/036
(Continued)

FOREIGN PATENT DOCUMENTS

JP          2017037066 A     2/2017

*Primary Examiner* — Alesa Allgood
(74) *Attorney, Agent, or Firm* — Crowell & Moring LLP

(57) ABSTRACT

The semiconductor device includes a Hall element, a first differential pair, a second differential pair, an output amplifier circuit, and a voltage divider circuit. The Hall element outputs a signal that is dependent on stress to be applied to a semiconductor substrate to the first differential pair. The voltage divider circuit divides a voltage into a divided voltage having a voltage dividing ratio that is dependent on the stress. The first differential pair outputs a first current based on the signal. The second differential pair outputs a second current based on the divided voltage and a reference voltage. The output amplifier circuit outputs a voltage based on the first and second currents. A gain of the output amplifier circuit is approximated by a sum of a difference between stress dependence coefficients of transconductances of the first and second differential pairs and a stress dependence coefficient of the voltage dividing ratio.

15 Claims, 4 Drawing Sheets

(51) Int. Cl.
*H03F 3/45* (2006.01)
*G01R 33/07* (2006.01)
*G01D 21/02* (2006.01)

(56) References Cited

U.S. PATENT DOCUMENTS

2016/0299199 A1* 10/2016 Cesaretti ................ G01R 33/07
2018/0017637 A1* 1/2018 Cesaretti ................ G01R 33/07

* cited by examiner

SEMICONDUCTOR DEVICE

RELATED APPLICATIONS

This application is a continuation application of U.S. application Ser. No. 16/800,399, titled "SEMICONDUCTOR DEVICE," and filed on Feb. 25, 2020, which claims priority to Japanese Patent Application No. 2019-048069, filed on Mar. 15, 2019, the entire contents of both of which is incorporated herein by reference.

BACKGROUND OF THE INVENTION

1. Field of the Invention

The present invention relates to a semiconductor device.

2. Description of the Related Art

Various physical quantity sensor elements are integrated on a semiconductor substrate together with an amplifier and a signal processing circuit so as to be used for various applications. Examples of the physical quantity sensor elements include a Hall element, a magnetoresistive element, a temperature sensor element, an optical sensor element, and a pressure sensor element.

When the physical quantity sensor element is integrated on the semiconductor substrate, a piezoelectric effect occurs due to a mechanical stress (hereinafter simply referred to as "stress") caused by, for example, a protective film formed on a wafer or resin sealing of a package. When the physical quantity sensor element is affected by the piezoelectric effect, a relationship between the physical quantity to be detected and a voltage-current conversion coefficient (hereinafter simply referred to as "sensitivity") varies. That is, the sensitivity of the physical quantity sensor element has stress dependence. When the sensitivity of the physical quantity sensor element has high stress dependence, the accuracy of detecting the physical quantity is decreased. It is therefore important to consider how to reduce the stress dependence of the sensitivity of the physical quantity sensor in order to improve the accuracy of detecting the physical quantity.

As an example of a technology of reducing the stress dependence of the sensitivity of the physical quantity sensor element, there has been known a device including a semiconductor element, a plurality of types of resistors having different piezoelectric coefficients, and an amplifier configured to output an output signal corresponding to a ratio of resistance values of the resistors. The device is configured to use a signal that is based on the output signal of the amplifier as a drive signal of the semiconductor element (the device is hereinafter referred to as "conventional device". As for the conventional device, see, for example, Japanese Patent Application Laid-open No. 2017-37066). In the conventional device, the stress dependence of the output signal of the amplifier is adjusted based on the piezoelectric coefficients of the resistors so that the stress dependence of the semiconductor element is reduced.

However, the above-mentioned conventional device has an issue in that there may occur a case in which the stress dependence of the sensitivity of the physical quantity sensor element cannot be appropriately compensated for.

More specifically, it is known that the piezoelectric coefficient of the resistor is dependent on an available resistor type and manufacturing process conditions such as an impurity concentration of the semiconductor element. Therefore, it may not be able to prepare a resistor having a piezoelectric coefficient appropriate for compensating for the stress dependence of the sensitivity of the physical quantity sensor element. When the piezoelectric coefficient of the resistor is insufficient, the stress dependence of the sensitivity of the physical quantity sensor element cannot be sufficiently compensated for. On the other hand, when the piezoelectric coefficient of the resistor is excessive, the stress dependence of the sensitivity of the physical quantity sensor element is excessively compensated for. When the stress dependence of the sensitivity of the physical quantity sensor element is excessively compensated for, the sign of the stress dependence of the entire semiconductor device may be reversed (brought to an opposite sign), and the stress dependence may be increased.

Further, when the piezoelectric coefficient of the resistor is insufficient, it is conceivable to increase a compensation amount with respect to the stress dependence of the sensitivity of the physical quantity sensor element to reduce the stress dependence of the sensitivity of the physical quantity sensor element. As a method of increasing the above-mentioned compensation amount, for example, there has been known a first method of arranging a plurality of amplifiers in multiple stages. When the first method is applied, the desired stress dependence can be obtained, but the number of amplifiers in the device is increased, and hence an area to be occupied by the circuit in the device and current consumption increase.

Further, it is also conceivable to apply a second method of providing stress dependence also to the drive current of the semiconductor element to increase the compensation amount with respect to the stress dependence of the sensitivity of the physical quantity sensor element. When the second method is applied, stress dependence is provided also to the drive current that originally does not have stress dependence, and hence current consumption varies in accordance with the stress applied to the semiconductor element. When the current consumption varies, false operation or false detection of the state occurs in a section configured to control or monitor operation based on the current consumption of the semiconductor device, and hence undesirable situations such as unstable operation of the semiconductor device may occur.

SUMMARY OF THE INVENTION

The present invention has been made in view of the above-mentioned circumstances, and has an object to provide a semiconductor device capable of detecting a physical quantity with high accuracy while an area and current consumption are kept small.

According to at least one embodiment of the present invention, there is provided a semiconductor device including a semiconductor substrate; a physical quantity sensor element formed on the semiconductor substrate; an amplifier formed on the semiconductor substrate, the amplifier being connected to an output portion of the physical quantity sensor element; a voltage divider circuit formed on the semiconductor substrate, the voltage divider circuit being connected between an output portion of the amplifier and a node to which a first reference voltage is applied; and an output terminal formed on the semiconductor substrate, the output terminal being configured to output an output voltage output from the output portion of the amplifier to an external circuit, wherein the physical quantity sensor element is configured to output, to the amplifier, a sensor output signal that is dependent on stress to be applied to the semiconductor substrate, wherein the voltage divider circuit includes first and second resistor circuits which exhibit dependence with respect to the stress to be applied to the semiconductor substrate, and is configured to divide a voltage difference between the output voltage and the first reference voltage into a divided voltage having a voltage dividing ratio that is determined by a ratio between a resistance value of the first resistor circuit and a resistance value of the second resistor circuit, wherein the amplifier includes a first input portion to which the sensor output signal is to be input; a second input portion to which the first reference voltage and the divided voltage are to be input; a first transconductance amplifier which has a first transconductance exhibiting dependence with respect to the stress to be applied to the semiconductor substrate, and is configured to output a first current based on the first transconductance and the sensor output signal input to the first input portion; a second transconductance amplifier which has a second transconductance exhibiting dependence with respect to the stress to be applied to the semiconductor substrate, and is configured to output a second current based on the second transconductance and the first reference voltage and the divided voltage input to the second input portion; a transimpedance amplifier, to which the first current and the second current are to be input in a combined manner, and is configured to output a voltage based on input currents; and the output portion configured to output the voltage output from the transimpedance amplifier to the output terminal, and wherein, when stress dependence coefficients with respect to the stress to be applied to the semiconductor substrate of the first transconductance, the second transconductance, and the voltage dividing ratio are represented by a first stress dependence coefficient, a second stress dependence coefficient, and a third stress dependence coefficient, respectively, a gain of the amplifier has a stress dependence coefficient approximated by a sum of a difference between the first stress dependence coefficient and the second stress dependence coefficient and the third stress dependence coefficient.

According to at least one embodiment of the present invention, there is provided a semiconductor device including a semiconductor substrate; a physical quantity sensor element formed on the semiconductor substrate; an amplifier which includes a first output port and a second output port, is connected to an output portion of the physical quantity sensor element, and is formed on the semiconductor substrate; a first output terminal which is configured to output a first output voltage output from the first output port to an external circuit and is formed on the semiconductor substrate; a second output terminal which is configured to output a second output voltage output from the second output port to an external circuit and is formed on the semiconductor substrate; and a voltage divider circuit which is connected between the first output port and the first output terminal and between the second output port and the second output terminal, and is formed on the semiconductor substrate, wherein the physical quantity sensor element is configured to output, to the amplifier, a sensor output signal that is dependent on stress to be applied to the semiconductor substrate, wherein the voltage divider circuit includes first and second resistor circuits which exhibit dependence with respect to the stress to be applied to the semiconductor substrate, and is configured to divide the output voltage into a first divided voltage and a second divided voltage that have a voltage dividing ratio determined by a ratio between a resistance value of the first resistor circuit and a resistance value of the second resistor circuit, wherein the amplifier includes a first input portion to which the sensor output signal is to be input; a second input portion to which the first divided voltage and the second divided voltage are to be input; a first transconductance amplifier which has a first transconductance exhibiting dependence with respect to the stress to be applied to the semiconductor substrate, and is configured to output a first current based on the first transconductance and the sensor output signal input to the first input portion; a second transconductance amplifier which has a second transconductance exhibiting dependence with respect to the stress to be applied to the semiconductor substrate, and is configured to output a second current based on the second transconductance and the first divided voltage and the second divided voltage input to the second input portion; a transimpedance amplifier, to which the first current and the second current are to be input in a combined manner, and which is configured to output a voltage based on input currents; and the output portion configured to output the voltage output from the transimpedance amplifier to the external circuit, and wherein, when stress dependence coefficients with respect to the stress to be applied to the semiconductor substrate of the first transconductance, the second transconductance, and the voltage dividing ratio are represented by a first stress dependence coefficient, a second stress dependence coefficient, and a third stress dependence coefficient, respectively, a gain of the amplifier has a stress dependence coefficient approximated by a sum of a difference between the first stress dependence coefficient and the second stress dependence coefficient and the third stress dependence coefficient.

According to at least one embodiment of the present invention, a physical quantity can be detected with high accuracy while an area and current consumption are kept small.

DETAILED DESCRIPTION OF THE PREFERRED EMBODIMENTS

Now, semiconductor devices according to embodiments of the present invention will be described with reference to the drawings. The semiconductor devices according to the embodiments of the present invention each include a physical quantity sensor including a physical quantity sensor element, such as a magnetic sensor element, a temperature sensor element, or an optical sensor element. In the embodiments described below, description is given of an example of a semiconductor device including, as an example of the physical quantity sensor, a Hall element on a semiconductor substrate. Further, in the description of the embodiments, isotropic stress may be simply referred to as "stress". Further, symbol "*" used in the description of the embodiments represents a multiplication sign. Therefore, in the description of the embodiments, a product of number "a" and number "b" is represented by "a*b".

First Embodiment

Figure 1:
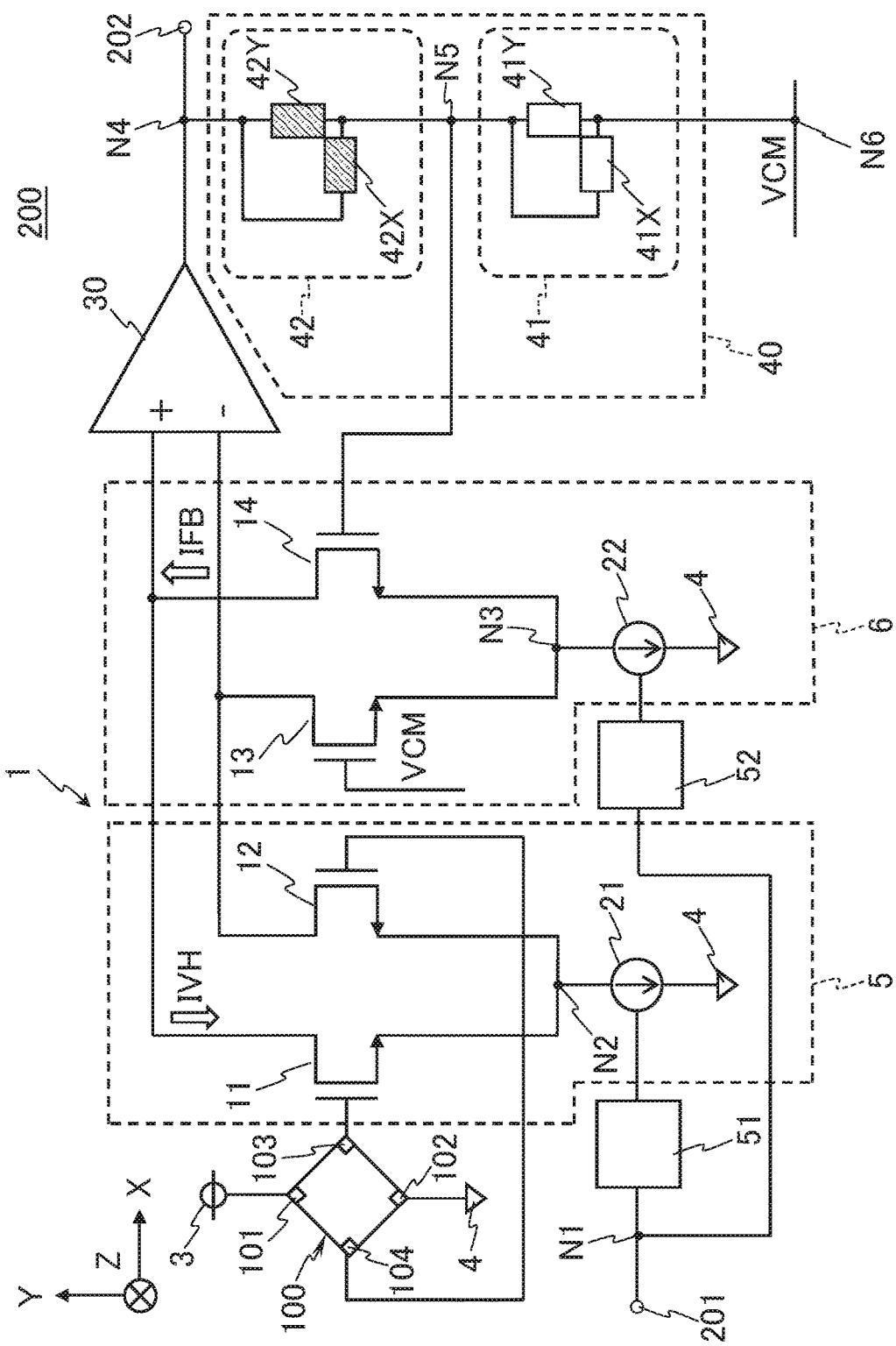
FIG. 1 is a schematic diagram for illustrating a configuration example of a semiconductor device according to a first embodiment of the present invention.

FIG. 1 is a schematic diagram for illustrating a semiconductor device 1. he semiconductor device 1 is an example of a semiconductor device according to a first embodiment of the present invention. In FIG. 1, a right-left direction is referred to as "X direction", an up-down direction is referred to as "Y direction", and a front-rear direction with respect to the drawing sheet is referred to as "Z direction".

The semiconductor device 1 includes, for example, an input terminal 201, a Hall element 100, differential pairs 5 and 6 and an output amplifier circuit 30 which serve as an amplifier, a voltage divider circuit 40, a voltage-current convener circuit 51 serving as a first voltage-current converter circuit, a voltage-current converter circuit 52 serving as a second voltage-current converter circuit, and an output terminal 202. The input terminal 201, the output terminal 202, the Hall element 100, the differential pairs 5 and 6, the output amplifier circuit 30, the voltage divider circuit 40, and the voltage-current converter circuits 51 and 52 are formed on a semiconductor substrate 200.

The Hall element 100 serving as a physical quantity sensor element includes first to fourth terminals 101 to 104. The differential pair 5 serving as a first transconductance amplifier includes a first N-type MOS transistor (hereinafter referred to as "NMOS transistor") 11, a second NMOS transistor 12, and a first current source 21. The differential pair 6 serving as a second transconductance amplifier includes a third NMOS transistor 13, a fourth NMOS transistor 14, and a second current source 22. The output amplifier circuit 30 serving as a transimpedance amplifier is a current-input voltage-output amplifier having low input impedance and sufficiently high transimpedance, and is formed by, for example, cascade connection between a gate-grounded amplifier stage and a source-grounded amplifier stage.

The voltage divider circuit 40 includes a resistor circuit 41 serving as a first resistor circuit and a resistor circuit 42 serving as a second resistor circuit, and is formed by connecting the resistor circuit 41 and the resistor circuit 42 to each other in series. The resistor circuit 41 includes a resistor 41X arranged in the X direction being a first direction and a resistor 41Y arranged in the Y direction being a second direction, and is formed by connecting the resistor 41X and the resistor 41Y to each other in parallel. The resistor circuit 42 includes a resistor 42X arranged in the X direction and a resistor 42Y arranged in the Y direction, and is formed by connecting the resistor 42X and the resistor 42Y to each other in parallel.

In this case, the resistor circuit 41 uses resistors having a first piezoelectric coefficient, and the resistor circuit 42 uses resistors having a second piezoelectric coefficient. That is, the resistor circuit 41 and the resistor circuit 42 use resistors having different piezoelectric coefficients. Specifically, the resistor circuit 41 includes P-well resistors, and the resistor circuit 42 includes N-well resistors. Further, the resistors 41X and 42X are resistors configured to allow a current to flow in the X direction, and the resistors 41Y and 42Y are resistors configured to allow a current to flow in the Y direction. Resistors 43X to 46X to be described later are also, similarly to the resistors 41X and 42X, resistors configured to allow a current to flow in the X direction.

Further, resistors 43Y to 46Y are also, similarly to the resistors 41Y and 42Y, resistors configured to allow a current to flow in the Y direction.

The first terminal 101 is connected to a first power supply terminal 3 which is a terminal of a first power supply (not shown), and the second terminal 102 is connected to a second power supply terminal 4 which is a terminal of a second power supply (not shown). Further, the third terminal 103 and the fourth terminal 104 are connected to a gate of the first NMOS transistor 11 and a gate of the second NMOS transistor 12, respectively.

A drain of the first NMOS transistor 11 is connected to a drain of the fourth NMOS transistor 14 and a positive input port of the output amplifier circuit 30. A source of the first NMOS transistor 11 is connected to a source of the second NMOS transistor 12. The first current source 21 is connected between the second power supply terminal 4 and a node N2 being a connection point between the source of the first NMOS transistor 11 and the source of the second NMOS transistor 12.

A drain of the second NMOS transistor 12 is connected to a drain of the third NMOS transistor 13 and a negative input port of the output amplifier circuit 30. A source of the third NMOS transistor 13 is connected to a source of the fourth NMOS transistor 14. The second current source 22 is connected between the second power supply terminal 4 and a node N3 being a connection point between the source of the third NMOS transistor 13 and the source of the fourth NMOS transistor 14.

The input terminal 201 and the output terminal 202 are configured to be connectable to an external circuit (not shown). The input terminal 201 is connected to each of input ports of the voltage-current converter circuits 51 and 52. An output port of the voltage-current converter circuit 51 is connected to the first current source 21. An output port of the voltage-current converter circuit 52 is connected to the second current source 22. The output terminal 202 is connected to an output port of the output amplifier circuit 30 serving as an output portion of the amplifier.

A node N4 is set between the output port of the output amplifier circuit 30 and the output terminal 202. The voltage divider circuit 40 is connected between the node N4 and a node N6. A node N5 being a connection point between the resistor circuit 41 and the resistor circuit 42 is connected to a gate of the fourth NMOS transistor 14. The node N6 is connected to a gate of the third NMOS transistor 13.

Figure 2:
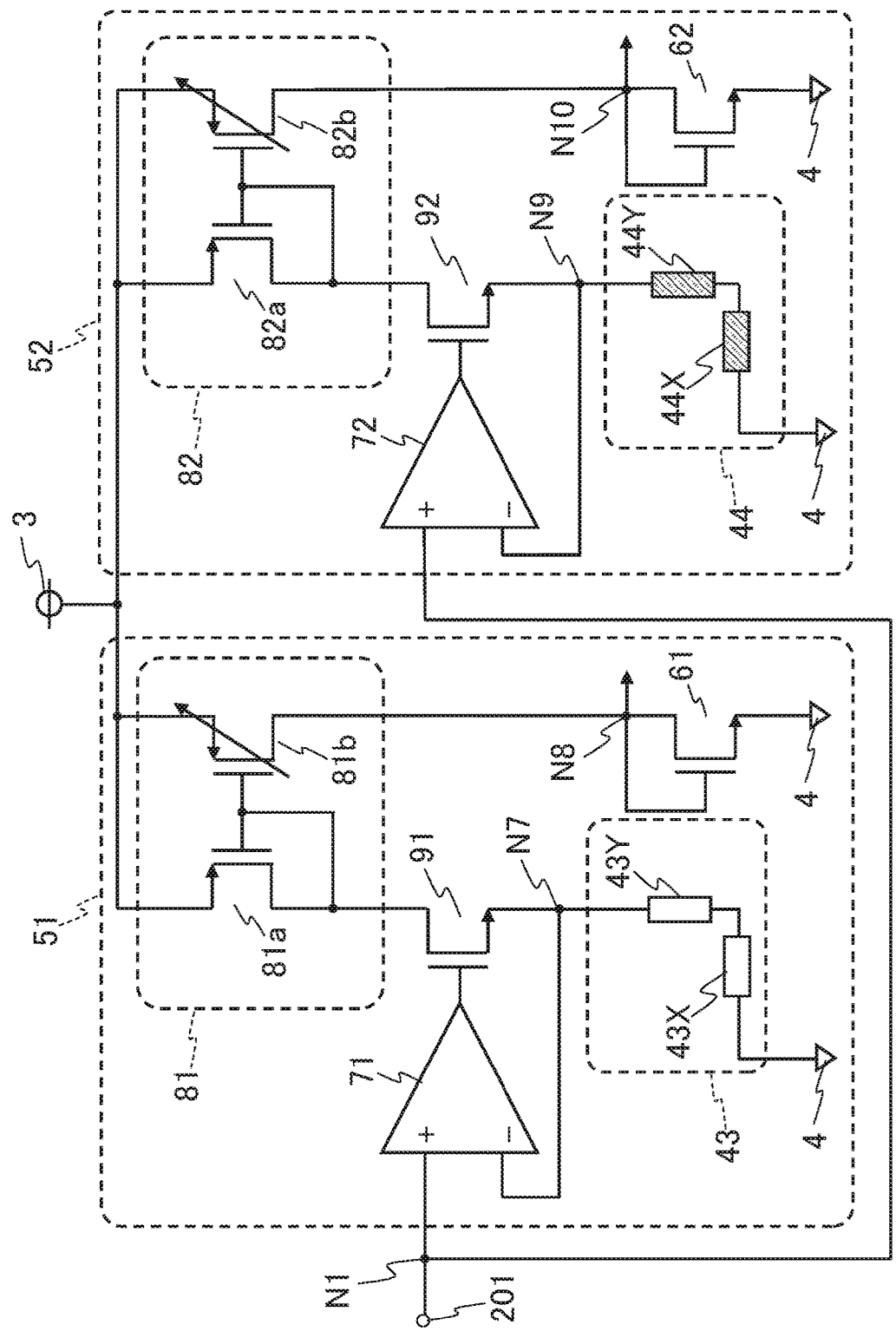
FIG. 2 is a schematic diagram for illustrating a configuration example of a voltage-current converter circuit included in the semiconductor device.

FIG. 2 is a schematic diagram for illustrating a configuration example of the voltage-current converter circuits 51 and 52.

The voltage-current converter circuit 51 includes, for example, a first operational amplifier 71, a fifth NMOS transistor 91 serving as a fifth field effect transistor, a resistor circuit 43, and a first current mirror circuit 81.

The resistor circuit 43 serving as a third resistor circuit includes, for example, a resistor 43X arranged in the X direction and a resistor 43Y arranged in the Y direction, and is formed by connecting the resistor 43X and the resistor 43Y to each other in series. The resistor circuit 43 includes, for example, P-well resistors. The first current mirror circuit 81 includes two transistors such as P-type MOS transistors (hereinafter referred to as "PMOS transistors") 81a and 81b, and is configured to have an adjustable mirror ratio.

The first operational amplifier 71 includes a non-inverting input port, an inverting input port, and an output port. The non-inverting input port is connected to the node N1. The inverting input port is connected to a source of the fifth NMOS transistor 91. The output port is connected to a gate of the fifth NMOS transistor 91.

A connection point between the inverting input port of the first operational amplifier 71 and the source of the fifth NMOS transistor 91 is set as a node N7. To the node N7, one end of the resistor circuit 43 is further connected. Further, another end of the resistor circuit 43 is connected to the second power supply terminal 4.

A drain of the fifth NMOS transistor 91 is connected to a drain and a gate of the first PMOS transistor 81*a*. That is, the gate and the drain of the first PMOS transistor 81*a* are short-circuited to each other. The gate of the first PMOS transistor 81*a* is connected to a gate of the second PMOS transistor 81*b*. Further, a source of the first PMOS transistor 81*a* is connected to a source of the second PMOS transistor 81*b* and the first power supply terminal 3.

A drain of the second PMOS transistor 81*b* is connected to a drain and a gate of a first saturation connection transistor 61, for example, a NMOS transistor in which a drain and a gate of the transistor are connected (short-circuited) to each other. A source of the first saturation connection transistor 61 is connected to the second power supply terminal 4. A node N8 being a connection point between the drain of the second PMOS transistor 81*b* and the drain and the gate of the first saturation connection transistor 61 corresponds to an output port of the voltage-current converter circuit 51, and is connected to the first current source 21.

The voltage-current converter circuit 52 includes a second operational amplifier 72, a sixth NMOS transistor 92 serving as a sixth field effect transistor, a resistor circuit 44, and a second current mirror circuit 82. In this case, the second operational amplifier 72, the sixth NMOS transistor 92, and the second current mirror circuit 82 are formed similarly to the first operational amplifier 71, the fifth NMOS transistor 91, and the first current mirror circuit 81, respectively. Therefore, a node N9 and a node N10 correspond to the node N7 and the node N8, respectively. The node N10 corresponds to an output port of the voltage-current converter circuit 52, and is connected to the second current source 22.

The resistor circuit 44 serving as a fourth resistor circuit has a configuration similar to that of the resistor circuit 43 in that the resistor circuit 44 includes, for example, a resistor 44X arranged in the X direction and a resistor 44Y arranged in the Y direction, and the resistor 44X and the resistor 44Y are connected to each other in series. Meanwhile, the resistor circuit 44 differs from the resistor circuit 43 in that the resistor circuit 44 has a piezoelectric coefficient that differs from that of the resistor circuit 43. Specifically, the resistor circuit 43 includes P-well resistors, while the resistor circuit 44 includes N-well resistors.

Next, an action of the semiconductor device 1 will be described.

A magnetic flux density Bin is applied to the Hall element 100 in a direction perpendicular to the semiconductor substrate 200, that is, in the Z direction. A drive current IDRV flows between the first terminal 101 and the second terminal 102, and a Hall voltage VH corresponding to the drive current IDRV is generated between the third terminal 103 and the fourth terminal 104 that serve as an output portion. The Hall voltage VH being a sensor output signal is represented by Expression (1) below.

$$VH = SI * IDRV * Bin \quad (1)$$

SI: magneto-electric conversion coefficient per unit drive current

Meanwhile, the Hall element 100 has dependence not only with respect to the magnetic flux density Bin, but also with respect to a stress σ [GPa] to be applied to the semiconductor substrate 200. The magneto-electric conversion coefficient SI per unit drive current is represented by Expression (2) below.

$$SI = SIref * (1 + \pi H * \sigma) \quad (2)$$

SIref: magneto-electric conversion coefficient per unit drive current at reference stress πH: piezoelectric coefficient of Hall element sensitivity As signal processing for canceling an offset voltage of the Hall element 100, there is known a so-called spinning current method. Drive currents are alternately supplied in directions of ±45 degrees with respect to an orientation flat of a <100> Si wafer which is generally used as the semiconductor substrate 200, and the spinning current method is applied to the Hall element 100. The piezoelectric coefficient πH included in the right-hand side term of Expression (2) above is +45 [%/GPa] in this case.

In this case, the stress σ corresponds to a compressive stress when the stress σ is negative, and corresponds to a tensile stress when the stress σ is positive. Therefore, the magneto-electric conversion coefficient SI per unit drive current is decreased when the compressive stress is applied to the semiconductor substrate 200, and is increased when the tensile stress is applied to the semiconductor substrate 200. That is, when the compressive stress is applied to the semiconductor substrate 200, the sensitivity with respect to the magnetism of the Hall element 100 is lower than that when no stress is applied, and, when the tensile stress is applied, the sensitivity is higher than that when no stress is applied.

Further, the stress σ included in the right-hand side term of Expression (2) above may be given as an isotropic stress σiso. The isotropic stress σiso is, as represented by Expression (3) below, defined by a sum of a perpendicular stress σx in the X direction and a perpendicular stress σy in the Y direction.

$$\sigma iso = \sigma x + \sigma y \quad (3)$$

In this case, the stress σ is defined not as an absolute stress but as a difference between a reference stress σref and the absolute stress to be applied to the semiconductor substrate 200. In this case, the reference stress σref is a stress applied to a semiconductor substrate 200 in any state such as a wafer state, a state immediately after package resin molding, or a state in which the package resin is dried.

The Hall voltage VH generated between the third terminal 103 and the fourth terminal 104 is input to the first differential pair 5 to be converted into a current (hereinafter referred to as "Hall current") IVH flowing through the first NMOS transistor 11. That is, the first differential pair 5 operates as a transconductor configured to convert the Hall voltage VH into the Hall current IVH.

A common-mode reference voltage VCM being a voltage at the node N6, that is, a first reference voltage, is input to the gate of the third NMOS transistor 13. Further, a feedback voltage being a voltage at the node N5 is input to the gate of the fourth NMOS transistor 14. The second differential pair 6 operates as a transconductor configured to convert a feedback voltage FB into a feedback current IFB.

Ideally, the output amplifier circuit 30 outputs a finite output voltage VOUT when a differential input current is zero. The output voltage VOUT is divided into a first divided voltage and a second divided voltage by the resistor circuit 41 and the resistor circuit 42, and the feedback voltage FB is generated at the node N5.

In this case, it is assumed that the resistors 41X and 41Y and the resistors 42X and 42Y are arranged at positions sufficiently departed from an end portion of the semiconductor substrate 200, and that a perpendicular stress in the Z direction and a shear stress are sufficiently small. Under this assumption, there is an arrangement that allows a combined resistance value of each of the resistor circuit 41 and the resistor circuit 42 to be dependent only on the isotropic stress σiso. Further, as an example of the arrangement that allows the combined resistance value of each of the resistor circuit 41 and the resistor circuit 42 to be dependent only on the isotropic stress σiso, there is arrangement of the resistors 41X and 41Y and the resistors 42X and 42Y described above. That is, under this assumption, the combined resistance value of each of the resistor circuit 41 and the resistor circuit 42 is dependent only on the isotropic stress σiso.

It is known that resistance values of the P-well resistors forming the first and third resistor circuits 41 and 43 and the N-well resistors forming the second and fourth resistor circuits 42 and 44 can be represented by Expressions (4) and (5) below with respect to the stress σ to be applied to the semiconductor substrate 200.

$$RP = RP\text{ref} * \{1 + 0.5*(\pi 11p + \pi 12p)*\sigma\} \tag{4}$$

$$RN = RN\text{ref} * \{1 + 0.5*(\pi 11n + \pi 12n)*\sigma\} \tag{5}$$

RPref: resistance value of P-well resistor at reference stress

RNref: resistance value of N-well resistor at reference stress

π11p: piezoelectric coefficient with respect to stress applied in direction parallel to current flowing through P-well resistor π12p: piezoelectric coefficient with respect to stress applied in direction orthogonal to current flowing through P-well resistor π11n: piezoelectric coefficient with respect to stress applied in direction parallel to current flowing through N-well resistor π12n: piezoelectric coefficient with respect to stress applied in direction orthogonal to current flowing through N-well resistor When piezoelectric coefficients in impurity concentration conditions of a general semiconductor manufacturing process are applied to π11p, π12p, π11n, and π12n included in the right-hand side terms of Expressions (4) and (5) above, Expressions (4) and (5) above are represented by Expressions (6) and (7) below.

$$RP = RP\text{ref} * (1 + 2.5[\%/GPa]*\sigma) \tag{6}$$

$$RN = RN\text{ref} * (1 - 24.4[\%/GPa]*\sigma) \tag{7}$$

As represented by Expressions (6) and (7) above, a ratio of change of the resistance value to the stress σ (hereinafter referred to as "stress dependence coefficient"), that is, the coefficient of the stress σ differs between the P-well resistor and the N-well resistor in positive and negative signs.

When the resistance value of the resistor circuit 41 and the resistance value of the resistor circuit 42 are represented by kp*RP and kn*RN, respectively, a voltage dividing ratio DivRat in the voltage divider circuit 40 is represented by Expression (8) below. Further, the feedback voltage FB is a factor for determining a gain from the Hall voltage VH to the output voltage VOUT, and is represented by Expression (9) below with use of the voltage dividing ratio DivRat. Therefore, the feedback voltage FB can be represented as in Expression (10) below with use of Expression (8) below. It is understood from Expressions (6) and (7) above and Expression (10) below that the feedback voltage FB is a function of the stress σ.

$$DivRat = kp*RP/(kp*RP + kn*RN) \tag{8}$$

kp: number of serially-connected resistor elements forming resistors 41X and 41Y (design constant)

kn: number of serially-connected resistor elements forming resistors 42X and 42Y (design constant)

$$FB = DivRat * VOUT \tag{9}$$

$$= VOLT * kp * RP / (kp * RP + kn * RN) \tag{10}$$

The transimpedance of the output amplifier circuit 30 is sufficiently high, and hence a sum of the Hall current IVH and the feedback current IFB can be regarded as zero. As a result, Expression (11) below is satisfied.

$$FB*Gm2 = VH*Gm1 \tag{11}$$

Gm1: transconductance of first transconductance amplifier (differential pair 5 in first embodiment) (hereinafter referred to as "first transconductance")

Gm2: transconductance of second transconductance amplifier (differential pair 6 in first embodiment) (hereinafter referred to as "second transconductance")

Expression (10) above may be substituted into the feedback voltage FB included in the left-hand side term of Expression (11) above so that the expression is solved for the output voltage VOUT of the output amplifier circuit 30 with respect to the Hall voltage VH (=VOUT/VH). In this manner, a gain G from the Hall voltage VH to the output voltage VOUT can be derived. The gain G can be represented by Expression (12) below.

$$G = VOUT/VH = (Gm1/Gm2)*(1 + kn/kp*RN/RP) \tag{12}$$

In this case, when it is assumed that k is sufficiently large, the gain G from the Hall voltage VH to the output voltage VOUT can be approximated as Expression (13) below.

$$G \approx \left(\frac{Gm1}{Gm2}\right) * \left(\frac{kn}{kp} * \frac{RN}{RP}\right) \tag{13}$$

Expression (13) above represents that the gain G is determined by a product of a ratio of a transconductance Gm1 of the differential pair 5 to a transconductance Gm2 of the differential pair 6 and a resistance ratio of the resistance value (=kn*RN) of the resistor circuit 42 to the resistance value (=kn*RP) of the resistor circuit 41. When the right-hand side term of Expression (13) above is transformed with use of Expressions (6) and (7) above, Expression (13) can be transformed into Expression (14) below.

$$\left(\frac{Gm1}{Gm2}\right)*\left(\frac{kn}{kp}*\frac{RN}{RP}\right) = \frac{\left(\frac{kn}{kp}\right)*\left(\frac{RN_{ref}}{RP_{ref}}\right)*(1-24.4[\%/Gpa]*\sigma)}{(1+2.5\%*\sigma)} \approx \left(\frac{kn}{kp}\right)*\left(\frac{RN_{ref}}{RP_{ref}}\right)*(1-26.9[\%/Gpa]*\sigma) \tag{14}$$

Based on Expression (14) above, it is understood that the ratio (resistance ratio) of the resistance value of the resistor circuit 42 to the resistance value of the resistor circuit 41 has a stress dependence coefficient of −26.9 [%/GPa] as a third stress dependence coefficient. In this case, the resistance ratio of the resistance value of the resistor circuit 42 to the resistance value of the resistor circuit 41 is a factor for determining the gain G. It is understood that, when the resistance ratio of the resistor circuit 42 to the resistor circuit 41 is combined with the stress dependence coefficient +45 [%/GPa] of the Hall element 100, the stress dependence coefficient of +18.1 [%/GPa] is obtained.

Next, description is given of a stress dependence coefficient of a transconductance ratio between the first differential pair 5 and the second differential pair 6.

A current value of the first current source 21 is determined by a current flowing into the first current source 21 from the voltage-current converter circuit 51. A current value of the second current source 22 is determined by a current flowing into the second current source 22 from the voltage-current converter circuit 52.

In the voltage-current converter circuit 51, when the gain of the first operational amplifier 71 is sufficiently large, negative feedback is applied so that virtual short-circuit is established between the two input ports. Therefore, one end of the resistor circuit 43 has the same potential as a reference voltage VREF being a second reference voltage. Further, the current flowing to the first current source 21 is generated based on a current IT1 serving as a first reference current. The current IT1 is a current (drain current) flowing through the fifth NMOS transistor 91 from the first power supply terminal 3 to the second power supply terminal 4, and flows through the resistor circuit 43. Further, the current IT1 is a current copied via the fifth NMOS transistor 91, the first current mirror circuit 81, and the first saturation connection transistor 61. When the current IT1 being a first reference current is to be copied, a mirror ratio of the first current mirror circuit 81 is taken into consideration, and the current proportional to the current IT1 is generated. The current obtained by copying the current IT1 is output to the first current source 21.

The voltage-current converter circuit 52 can be considered similarly to the voltage-current converter circuit 51. That is, the current flowing to the second current source 22 is generated based on a current IT2 serving as a second reference current. The current IT2 is a current (drain current) flowing through the sixth NMOS transistor 92 from the first power supply terminal 3 to the second power supply terminal 4, and flows through the resistor circuit 44. Further, the current IT2 is a current copied via the sixth NMOS transistor 92, the second current mirror circuit 82, and the second saturation connection transistor 62. When the current IT2 being a second reference current is to be copied, a mirror ratio of the second current mirror circuit 82 is taken into consideration, and the current proportional to the current IT2 is generated. The current obtained by copying the current IT2 is output to the second current source 22.

In this case, the resistor circuit 43 has, similarly to the resistor circuit 41, a resistance value dependent on the isotropic stress. Therefore, the resistor circuit 43 has a stress dependence coefficient being a sixth stress dependence coefficient, and a resistance value of the resistor circuit 43 can be represented by, for example, mRN. A voltage applied across both ends of the resistor circuit 43 is equal to the reference voltage VREF, and hence the current IT1 satisfies Expression (15) below when the resistance value of the resistor circuit 43 is represented by mRN. Further, the resistor circuit 44 has, similarly to the resistor circuit 42, a resistance value dependent on the isotropic stress. That is, the resistor circuit 44 has a stress dependence coefficient being a seventh stress dependence coefficient. The current IT2 also satisfies, similarly to the current IT1, Expression (16) below when the resistance value of the resistor circuit 44 is represented by RN.

$$IT1 = VREF/mRP \quad (15)$$

$$IT2 = VREF/RN \quad (16)$$

When Expression (7) described above is substituted into the right-hand side term of Expression (15) above, Expression (17) below is satisfied. Further, when Expression (7) described above is substituted into the right-hand side term of Expression (16) above, Expression (18) below is satisfied.

$$IT1 = (VREF/mRPref)/(1+2.5[\%/GPa]*\sigma) \approx (VREF/mRPref)*(1-2.5[\%/GPa]*\sigma) \quad (17)$$

$$IT2 = (VREF/RNref)/(1+24.4[\%/GPa]*\sigma) \approx (VREF/RNref)*(1-24.4[\%/GPa]*\sigma) \quad (18)$$

It is understood from Expression (17) above that the current IT1 has negative dependence with respect to the stress σ to be applied to the semiconductor substrate 200. Expression (17) above represents that, in other words, the first current source 21 has a stress dependence coefficient of −2.5 [%/GPa] as a fourth stress dependence coefficient with respect to the stress σ to be applied to the semiconductor substrate 200. It is understood from Expression (18) above that the current IT2 has positive dependence with respect to the stress σ. Expression (18) above represents that, in other words, the second current source 22 has a stress dependence coefficient of +24.4 [%/GPa] as a fifth stress dependence coefficient with respect to the stress σ to be applied to the semiconductor substrate 200. As described above, the stress dependence coefficient of the first current source 21 and the stress dependence coefficient of the second current source 22 are different from each other.

Further, the first current source 21 and the second current source 22 are configured so that the currents IT1 and IT2 become equal to each other at the reference stress σref. That is, the first current source 21 and the second current source 22 are configured so as to satisfy following Expression (19) which is derived from Expressions (15) and (16) above.

$$m = RN/RP \quad (19)$$

There may occur a case in which the currents IT1 and IT2 do not always become equal to each other at the reference stress σref. Even in this case, when the mirror ratios of the first current mirror circuit 81 and the second current mirror circuit 82 can be adjusted, each of the currents IT1 and IT2 can be adjusted so that Expression (19) above is satisfied.

In this case, the transconductance Gm1 of the first differential pair 5 is proportional to the square root of the current value of the first current source 21 having stress dependence, and hence the transconductance Gm1 of the first differential pair 5 has a stress dependence coefficient as a first stress dependence coefficient. The transconductance Gm2 of the second differential pair 6 is proportional to the square root of the current value of the second current source 22 having stress dependence, and hence the transconductance Gm2 of the second differential pair 6 has a stress dependence coefficient as a second stress dependence coefficient.

When dimensions of the first to fourth NMOS transistors 11 to 14 are equal to each other, and K represents a design constant, Expressions (20) and (21) below are satisfied.

$$Gm1 = K*\sqrt{(IT1)} \quad (20)$$

$$Gm2 = K*\sqrt{(IT2)} \quad (20)$$

With use of Expressions (20) and (21) above and Expressions (17) and (18) described above, a transconductance ratio (Gm1/Gm2) can be represented by Expression (22) below.

$$\frac{GM1}{GM2} = \sqrt{\frac{IT1}{IT2}} \qquad (22)$$

$$= \frac{\sqrt{(VREF/mRPref)*(1-2.5[\%/GPa]*\sigma)}}{\sqrt{(VREF/RNref)*(1+24.4[\%/GPa]*\sigma)}}$$

$$\approx \frac{\sqrt{(1-2.5[\%/GPa]*\sigma)}}{\sqrt{(1+24.4[\%/GPa]*\sigma)}}$$

$$= \sqrt{(1-26.9[\%/GPa]*\sigma)}$$

$$\approx 1-13.5[\%/GPa]*\sigma$$

Based on Expression (22) above, the transconductance ratio between the first differential pair 5 and the second differential pair 6 is −13.5 [%/GPa]. This transconductance ratio is one factor for determining the gain G and has a negative stress dependence coefficient.

Next, a stress dependence coefficient of a magneto-electric conversion coefficient (KH*G) of the entire semiconductor device 1 from the magnetic flux density Bin to the output voltage VOUT is obtained. The magneto-electric conversion coefficient (KH*G) can be represented by Expression (23) below.

$$KH*G = SI*IDRV*G \qquad (23)$$

$$= SIref*(1+45[\%/GPa]*\sigma)*$$

$$IDRV*(1-13.5[\%/GPa]*\sigma)*$$

$$k*(RNref/RPref)*(1-26.9[\%/GPa]*\sigma)$$

$$\approx SIref*IDRV*k*(RNref/RPref)*$$

$$(1+4.6[\%/GPa]*\sigma)$$

Based on Expression (23) above, the stress dependence coefficient of the magneto-electric conversion coefficient (KH*G) of the entire semiconductor device 1 is +4.6 [%/GPa]. Therefore, it is understood that the stress dependence coefficient of the magneto-electric conversion coefficient of the entire semiconductor device 1 is suppressed to about 1/10 of the stress dependence coefficient +45 [%/GPa] of the Hall element 100 in absolute value.

According to the first embodiment, the transconductance ratio between the first differential pair 5 and the second differential pair 6 and the voltage dividing ratio of the voltage divider circuit 40 including the resistor circuit 41 and the resistor circuit 42 can have the stress dependence, and hence a larger stress dependence coefficient can be obtained. Therefore, according to the first embodiment, it is possible to provide a semiconductor device having a small circuit scale, low current consumption, and reduced stress dependence of the sensitivity of the physical quantity sensor element, for example, the Hall element 100. Further, when the Hall element 100 is applied as the physical quantity sensor element, the stress dependence coefficient of the magneto-electric conversion coefficient of the entire semiconductor device 1 is about 1/10 of the stress dependence coefficient +45 [%/GPa] of the Hall element 100. Thus, although the Hall element 100 may has significant sensitivity to variation with respect to stress, a large suppression effect of the stress dependence coefficient can be obtained. Further, the gain G from the Hall voltage VH to the output voltage VOUT can be obtained by, as described above, with use of an approximate expression, a sum of a difference between the stress dependence coefficient of the transconductance Gm1 of the first differential pair 5 and the stress dependence coefficient of the transconductance Gm2 of the second differential pair 6 and the stress dependence coefficient of the voltage dividing ratio of the voltage divider circuit 40, and hence the circuit can be easily designed.

In the above-mentioned first embodiment, description has been given of an example in which the resistor circuit 41 and the resistor circuit 43 include P-well resistors, and the resistor circuit 42 and the resistor circuit 44 include N-well resistors, but the present invention is not limited to this example.

In the resistor circuit 41 and the resistor circuit 42, one of the resistor circuit 41 and the resistor circuit 42 may include N-well resistors, and another one of the resistor circuit 41 and the resistor circuit 42 may include P-well resistors. That is, the resistor circuit 41 may include well resistors of a first type which is one of the N type and the P type, and the resistor circuit 42 may include well resistors of a second type which is another one of the N type and the P type.

The resistor circuit 43 and the resistor circuit 44 are similar to the resistor circuit 41 and the resistor circuit 42. That is, the resistor circuit 43 may include well resistors of a first type which is one of the N type and the P type, and the resistor circuit 44 may include well resistors of a second type which is another one of the N type and the P type.

Further, each of the first to fourth resistor circuits 41 to 44 may be configured to include, other than the well resistor, at least one element selected from the group consisting of a diffused resistor, a polysilicon resistor, and a field effect transistor. In this case, when the resistor circuit 41 includes N-type elements, the resistor circuit 42 is configured to include elements having the other type, that is, P-type elements. When the resistor circuit 41 includes P-type elements, the resistor circuit 42 is configured to include elements having the other type, that is, N-type elements. The resistor circuit 43 and the resistor circuit 44 are similar to the resistor circuit 41 and the resistor circuit 42.

The semiconductor device 1 illustrated in FIG. 1 represents an example including the voltage-current converter circuits 51 and 52 and the input terminal 201, but the semiconductor device 1 is not always required to include the voltage-current converter circuits 51 and 52 and the input terminal 201. The voltage-current converter circuit 51 or the voltage-current converter circuit 52 may be omitted from the semiconductor device 1 exemplified in FIG. 1, or the voltage-current converter circuits 51 and 52 and the input terminal 201 may be omitted therefrom.

Second Embodiment

Figure 3:
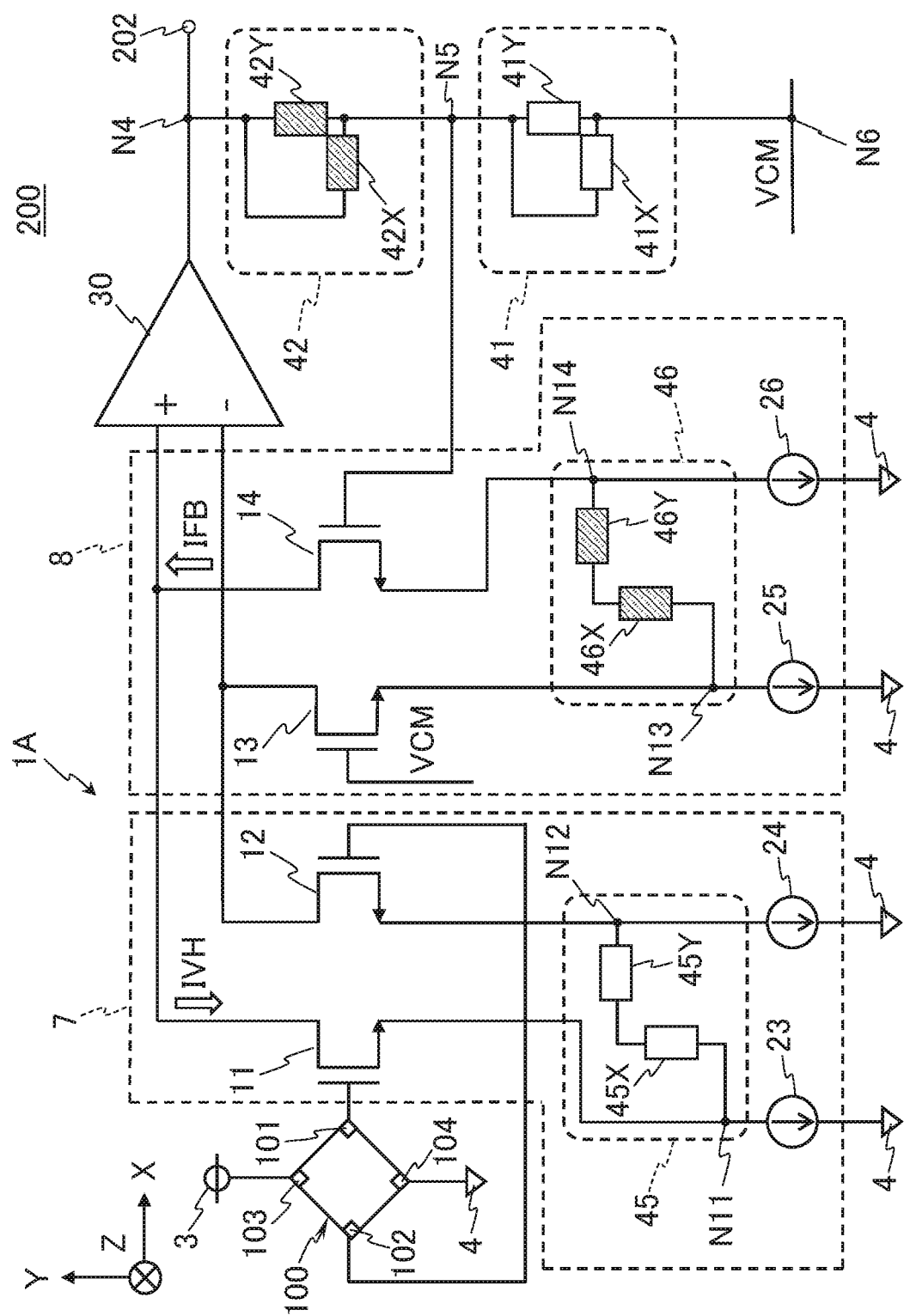
FIG. 3 is a schematic diagram for illustrating a configuration example of a semiconductor device according to a second embodiment of the present invention.

FIG. 3 is a schematic diagram for illustrating a semiconductor device 1A. The semiconductor device 1A is an example of a semiconductor device according to a second embodiment of the present invention. The X direction, the Y direction, and the Z direction illustrated in FIG. 3 are the same as those in FIG. 1.

The semiconductor device 1A differs from the semiconductor device 1 in the configurations of the first and second transconductance amplifiers, but other points are similar to those of the semiconductor device 1. In view of this, in the second embodiment, the above-mentioned difference is mainly described, and description overlapping with that for the semiconductor device 1 is omitted.

The semiconductor device 1A includes the Hall element 100, an operational transconductance amplifier (OTA) 7, an OTA 8, the output amplifier circuit 30, the voltage divider circuit 40, and the output terminal 202.

The OTA 7 serving as a first transconductance amplifier includes the first NMOS transistor 11, the second NMOS transistor 12, a third current source 23, a fourth current source 24, and a resistor circuit 45.

The source terminal of the first NMOS transistor 11 is connected to one end of the third current source 23. Another end of the third current source 23 is connected to the second power supply terminal 4. The source terminal of the second NMOS transistor 11 is connected to one end of the fourth current source 24. Another end of the fourth current source 24 is connected to the second power supply terminal 4. The resistor circuit 45 serving as a third resistor circuit is connected between a node N11 corresponding to the one end of the third current source 23 and a node N12 corresponding to the one end of the fourth current source 24.

The resistor circuit 45 includes, for example, a resistor 45X arranged in the X direction and a resistor 45Y arranged in the Y direction, and is formed by connecting the resistor 45X and the resistor 45Y to each other in series. Further, the resistor circuit 45 includes, for example, P-well resistors, and similarly to the first and third resistor circuits 41 and 43 or other circuits, has a resistance value dependent on isotropic stress. That is, the resistor circuit 45 serving as the third resistor circuit has a stress dependence coefficient as a sixth stress dependence coefficient.

The OTA 8 serving as a second transconductance amplifier includes the third NMOS transistor 13, the fourth NMOS transistor 14, a fifth current source 25, a sixth current source 26, and a resistor circuit 46.

The source terminal of the third NMOS transistor 13 is connected to one end of the fifth current source 25. Another end of the fifth current source 25 is connected to the second power supply terminal 4. The source terminal of the fourth NMOS transistor 14 is connected to one end of the sixth current source 26. Another end of the sixth current source 26 is connected to the second power supply terminal 4. The resistor circuit 46 serving as a fourth resistor circuit is connected between a node N13 corresponding to the one end of the fifth current source 25 and a node N14 corresponding to the one end of the sixth current source 26.

The resistor circuit 46 has a configuration similar to that of the resistor circuit 45 in that the resistor circuit 46 includes, for example, a resistor 46X arranged in the X direction and a resistor 46Y arranged in the Y direction, and the resistor 46X and the resistor 46Y are connected to each other in series. Meanwhile, the resistor circuit 46 differs from the resistor circuit 45 in that the resistor circuit 46 has a piezoelectric coefficient that differs from that of the resistor circuit 45. Specifically, the resistor circuit 45 includes P-well resistors, while the resistor circuit 46 includes N-well resistors. Further, the resistor circuit 46 has, similarly to the second and fourth resistor circuits 42 and 44 or other resistor circuits, a resistance value dependent on isotropic stress. That is, the resistor circuit 46 serving as the fourth resistor circuit has a stress dependence coefficient as a seventh stress dependence coefficient.

Next, an action of the semiconductor device 1A will be described.

A transconductance Gm1 of the OTA 7 and a transconductance Gm2 of the OTA 8 serving as the second transconductance amplifier are represented by Expression (24) below and Expression (25) below, respectively.

$$Gm1 = gm/(1+gm*n*RP) \quad (24)$$

$$Gm2 = gm/(1+gm*RN) \quad (25)$$

gm: transconductance of first to fourth NMOS transistors 11 to 14 n: design constant

In this case, when gm*n*RP>>1 is satisfied, Expression (24) above can be replaced with Expression (26) below. Further, when gm*RN>>1 is satisfied, Expression (25) above can be replaced with Expression (27) below.

$$Gm1 \approx 1/(n*RP) \quad (26)$$

$$Gm2 \approx 1/RN \quad (27)$$

Based on Expressions (26) and (27) above, the first transconductance Gm1 and the second transconductance Gm2 are each a function of a reciprocal of the resistance value. The transconductance ratio of the first transconductance Gm1 to the second transconductance Gm2 can be represented by Expression (28) below with use of Expressions (26) and (27) above.

$$(Gm1/Gm2) = RN/(n*RP) \quad (28)$$

When the right-hand side term of Expression (28) above is transformed with use of Expressions (6) and (7) described above, the transconductance ratio of the first transconductance Gm1 to the second transconductance Gm2 is represented by Expression (29) below.

$$(Gm1/Gm2) = RNref/(n*RPref)*(1-26.9[\%/GPa]*\sigma) \quad (29)$$

In this case, in order to set the transconductance ratio at the reference stress σref to 1, the design constant n is represented by Expression (30) below.

$$n = RN/RP \quad (30)$$

When Expression (30) above is satisfied, the transconductance ratio of the first transconductance Gm1 to the second transconductance Gm2 is represented by Expression (31) below.

$$(Gm1/Gm2) = (1-26.9[\%/GPa]*\sigma) \quad (31)$$

Based on Expression (31) above, the transconductance ratio of the first transconductance Gm1 to the second transconductance Gm2 is −26.9 [%/GPa]. This transconductance ratio is one factor for determining the gain G and has a negative stress dependence coefficient. The stress dependence coefficient is the same as the resistance ratio of the resistor circuit 42 to the resistor circuit 41, i.e., −26.9 [%/GPa].

Further, the semiconductor device 1A does not substantially differ from the semiconductor device 1 in sections of the output amplifier circuit 30 and the voltage divider circuit 40. Therefore, the stress dependence coefficient of the magneto-electric conversion coefficient (KH*G) of the entire semiconductor device 1A is represented by Expression (32) below.

$$\begin{aligned} KH*G &= SI*IDRV*G \\ &= SIref*(1+45[\%/GPa]*\sigma)*IDRV* \\ &\quad (1-26.9[\%/GPa]*\sigma)*k*(RNref/RPref)* \\ &\quad (1-26.9[\%/GPa]*\sigma) \end{aligned} \quad (32)$$

-continued $$= SIref * IDRV * k * (RNref/RPref) *$$
$$(1 - 8.8[\%/GPa] * \sigma)$$

Based on Expression (32) above, the stress dependence coefficient of the magneto-electric conversion coefficient (KH*G) of the entire semiconductor device 1A is −8.8 [%/GPa]. Therefore, the stress dependence coefficient of the magneto-electric conversion coefficient of the entire semiconductor device 1A provides excessive compensation for +45 [%/GPa] which is the stress dependence coefficient of the Hall element 100. Therefore, it is understood that, although the sign is reversed from positive to negative, the stress dependence coefficient is suppressed to about ⅕ in absolute value.

According to the second embodiment, the transconductance ratio between the OTAs 7 and 8 and the voltage dividing ratio of the voltage divider circuit 40 including the resistor circuit 41 and the resistor circuit 42 can have the stress dependence, and hence a larger stress dependence coefficient can be obtained. Therefore, according to the second embodiment, it is possible to provide a semiconductor device having a small circuit scale, low current consumption, and reduced stress dependence of the sensitivity of the physical quantity sensor element, for example, the Hall element 100.

Further, when the Hall element 100 is applied as the physical quantity sensor element, the stress dependence coefficient of the magneto-electric conversion coefficient of the entire semiconductor device 1A is about ⅕, in absolute value, of the stress dependence coefficient +45 [%/GPa] of the Hall element 100. Thus, although the Hall element 100 may has significant sensitivity to variation with respect to stress, a large suppression effect of the stress dependence coefficient can be obtained. Further, the gain G from the Hall voltage VH to the output voltage VOUT can be obtained by, as described above, with use of an approximate expression, a sum of a difference between the stress dependence coefficient of the transconductance Gm1 of the OTA 7 and the stress dependence coefficient of the transconductance Gm2 of the OTA 8 and the stress dependence coefficient of the voltage dividing ratio of the voltage divider circuit 40, and hence the circuit can be easily designed.

Further, the semiconductor device 1A can apply stress responsiveness to the transconductance ratio (Gm1/Gm2) of the transconductance Gm1 of the first transconductance amplifier to the transconductance Gm2 of the second transconductance amplifier without including the voltage-current converter circuits 51 and 52. As described above, in the semiconductor device 1A, as compared to the semiconductor device 1, the circuit scale can be further decreased, and a further larger stress dependence coefficient can be obtained.

In the above-mentioned second embodiment, description has been given of an example in which the resistor circuit 41 and the resistor circuit 45 include P-well resistors, and the resistor circuit 42 and the resistor circuit 46 include N-well resistors, but the present invention is not limited to this example.

The resistor circuit 41 may include well resistors of a first type which is one of the N type and the P type, and the resistor circuit 42 may include well resistors of a second type which is another one of the N type and the P type. Further, the resistor circuit 45 and the resistor circuit 46 may be configured similarly to the resistor circuit 41 and the resistor circuit 42 so that the resistor circuit 45 includes well resistors of a first type which is one of the N type and the P type, and the resistor circuit 46 includes well resistors of a second type which is another one of the N type and the P type.

Further, each of the fifth and sixth resistor circuits 45 and 46 may be configured to include, other than the well resistor, at least one element selected from the group consisting of a diffused resistor, a polysilicon resistor, and a field effect transistor. In this case, when the resistor circuit 41 includes N-type elements, the resistor circuit 42 is configured to include elements having the other type, that is, P-type elements. When the resistor circuit 41 includes P-type elements, the resistor circuit 42 is configured to include elements having the other type, that is, N-type elements. The resistor circuit 45 and the resistor circuit 46 are similar to the resistor circuit 41 and the resistor circuit 42.

The present invention is not limited to the above-mentioned embodiments as they are, and can be embodied in various modes other than the above-mentioned examples in the embodying stage. Further, various omissions, replacements, and changes can be made thereto without departing from the gist of the present invention. Those embodiments and modifications thereof are included in the scope or gist of the present invention, and are also included in the range of the invention described in the scope of claims and equivalents thereof.

Figure 4:
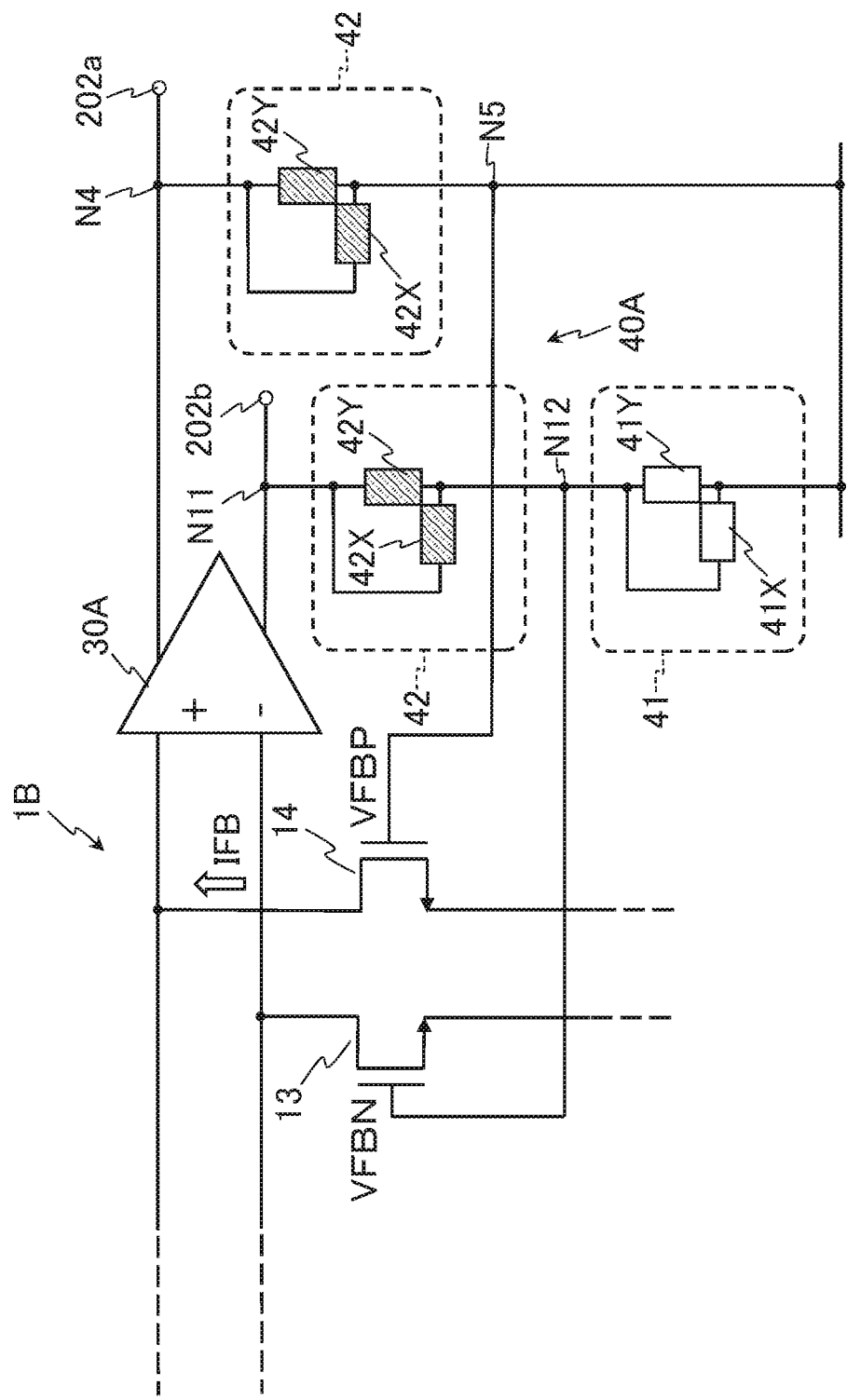
FIG. 4 is a schematic diagram for illustrating an example of a part of a semiconductor device according to another embodiment of the present invention, the semiconductor device including a fully differential amplifier.

For example, in the above-mentioned embodiments, description has been given of an example in which the amplifier of each of the semiconductor devices 1 and 1A has a differential input/single-phase output configuration, but each of the semiconductor devices 1 and 1A may include a so-called fully differential amplifier having a differential input/differential output configuration as illustrated in FIG. 4 to be referred to later. That is, a semiconductor device including, in place of the output amplifier circuit 30 of each of the semiconductor devices 1 and 1A, an output amplifier circuit 30A may be applied.

FIG. 4 is a schematic diagram for illustrating an example of a part of a semiconductor device 1B which is another example of the semiconductor device according to the embodiments, and includes a fully differential amplifier including the output amplifier circuit 30A instead of the output amplifier circuit 30.

The semiconductor device 1B includes the output amplifier circuit 30A including two output ports, and hence includes a first output terminal 202a and a second output terminal 202b. The output amplifier circuit 30A includes a positive-phase output port and a negative-phase output port. The positive-phase output port and the negative-phase output port are connected to the first output terminal 202a and the second output terminal 202b, respectively. A node N11 is set on an electric path connecting between the negative-phase output port and the second output terminal 202b. A voltage divider circuit 40A is connected between the node N11 and the node N4.

The voltage divider circuit 40A is formed by further connecting a resistor circuit 42 to the voltage divider circuit 40 in series, and is configured to obtain a voltage VFBP as a first divided voltage and a voltage VFBN as a second divided voltage. The voltage VFBN is input to the gate of the third NMOS transistor 13. The voltage VFBP is input to the gate of the fourth NMOS transistor 14. The semiconductor device 1B is increased in circuit scale as compared to the semiconductor devices 1 and 1A, but can obtain an excellent common-mode rejection ratio characteristic, and hence there is an advantage in that the semiconductor device 1B is robust against disturbance.

In the embodiments, description has been given of an example in which the input transistor of each of the differential pairs 5 and 6 is formed of an NMOS transistor. However, a tail current source may be a source current source, and the input transistor may be formed of a PMOS transistor. Alternatively, there may be employed a so-called rail-to-rail input stage configuration in which both of the NMOS transistor input differential pair and the PMOS transistor input differential pair are connected to each other in parallel. Further, in the above-mentioned embodiments, description has been given of an example in which the input transistor of each of the differential pairs 5 and 6 and the OTAs 7 and 8 is formed of a MOS transistor (MOSFET), but the present invention is not limited thereto. The first to fourth NMOS transistors 11 to 14 may be formed of, in place of the MOSFETs, for example, field effect transistors (FETs) other than MOSFETs, such as MIS-FETs and junction FETs (JFETs).

In the embodiments, as a suitable combination for canceling the stress dependence of the sensitivity of the Hall element 100, there is employed a combination in which the type of resistors for determining the transconductance ratio (Gm1/Gm2) and the type of resistors for determining the voltage dividing ratio in the voltage divider circuit 40 are the same, but a combination of resistors having different types can be used to achieve different stress dependence coefficients suitable for canceling the stress dependence of the sensitivity of another physical quantity sensor.

For example, in the above-mentioned embodiments, description has been given of an example in which both of the resistor circuit 41 and the resistor circuit 43 have the same P type, but the resistor circuit 41 and the resistor circuit 43 are not always required to have the same type. For example, the resistor circuit 41 may include N-well resistors, and the resistor circuit 43 may include P-well resistors. In this case, the resistor circuit 42 includes P-well resistors, and the resistor circuit 44 includes N-well resistors. Further, description has been given of an example in which both of the resistor circuit 41 and the resistor circuit 45 have the same P type, but the resistor circuit 41 and the resistor circuit 45 are not always required to have the same type. For example, the resistor circuit 41 may include N-well resistors, and the resistor circuit 45 may include P-well resistors. In this case, the resistor circuit 42 includes P-well resistors, and the resistor circuit 44 includes N-well resistors.

The resistors 41X to 46X arranged in the X direction and the resistors 41Y to 46Y arranged in the Y direction may each be formed of one resistor element, or may be formed of a plurality of resistor elements. Further, connection of the resistors 41X to 46X and the resistors 41Y to 46Y is not limited to the above-mentioned example.

For example, in the resistor circuit 41, when the resistance value of the resistor 41X arranged in the X direction (when the resistor 41X is formed of a plurality of resistor elements, a combined resistance value thereof) and the resistance value of the resistor 41Y arranged in the Y direction (when the resistor 41Y is formed of a plurality of resistor elements, a combined resistance value thereof) are equal to each other, it does not matter whether the connection of the resistor 41X and the resistor 41Y is parallel connection or serial connection. The reason therefor is because, when the resistance value of the resistor 41X arranged in the X direction and the resistance value of the resistor 41Y arranged in the Y direction are equal to each other, the resistance value of the entire resistor circuit 41 can be brought dependent on the isotropic stress. The content of the foregoing description regarding the connection between the resistor 41X and the resistor 41Y in the resistor circuit 41 can be applied also to the connection between the resistors 42X to 46X and the resistors 42Y to 46Y in the second to sixth resistor circuits 42 to 46.

In the embodiments, description has been given of the output amplifier circuit 30 in which cascade connection is established between the gate-grounded amplifier stage serving as a gate-grounded amplifier and the source-grounded amplifier stage serving as a source-grounded amplifier, but the present invention is not limited thereto. The output amplifier circuit 30 may be configured with use of one of the gate-grounded amplifier stage and the source-grounded amplifier stage.

In the embodiments, description has been given of an example in which, from the viewpoint of correcting process variations between the P-well resistors and the N-well resistors, each of the current mirror circuits 81 and 82 is configured to have an adjustable mirror ratio, but the present invention is not limited to this example. For example, both of the current mirror circuits 81 and 82 may have fixed mirror ratios (that cannot be adjusted), or one of the current mirror circuits 81 and 82 may have a fixed mirror ratio.

Further, in the above-mentioned embodiments, description has been given of an example in which the voltage-current converter circuit 51 includes the fifth NMOS transistor 91, and the voltage-current converter circuit 52 includes the sixth NMOS transistor 92, but the present invention is not limited thereto. For example, the fifth NMOS transistor 91 and the sixth NMOS transistor 92 may be FETs other than MOSFETs, such as MIS-FETs or junction FETs (JFETs).

Further, in the embodiments, description has been given of a case in which the Hall element is used as an example of the physical quantity sensor element, but the present invention is not limited to this example. Similarly to the case of the Hall element, the present invention is applicable also for various physical quantity sensors other than the Hall element, such as a magnetic sensor element, a temperature sensor, an optical sensor, and a pressure sensor element.

What is claimed is:

1. A semiconductor device, comprising:
   a semiconductor substrate;
   a physical quantity sensor element formed on the semiconductor substrate;
   an amplifier formed on the semiconductor substrate, the amplifier being connected to an output portion of the physical quantity sensor element;
   a voltage divider circuit which is formed on the semiconductor substrate, and which is configured to divide a voltage difference between a first end of the voltage divider circuit and a second end of the voltage divider, the first end being connected to an output portion of the amplifier; and
   at least one output terminal formed on the semiconductor substrate, the at least one output terminal being configured to output an output voltage output from the output portion of the amplifier to an external circuit,
   wherein the physical quantity sensor element is configured to output, to the amplifier, a sensor output signal which is dependent on stress to be applied to the semiconductor substrate, wherein the voltage divider circuit includes first and second resistor circuits which exhibit dependence with respect to the stress to be applied to the semiconductor substrate, and is configured to generate at least one voltage based upon the output voltage output from the amplifier, wherein the amplifier includes:
- a first input portion to which the sensor output signal is to be input;
- a second input portion to which the at least one voltage is to be input;
- a first transconductance amplifier which has a first transconductance exhibiting dependence with respect to the stress to be applied to the semiconductor substrate and is configured to output a first current based on the first transconductance and the sensor output signal input to the first input portion;
- a second transconductance amplifier which has a second transconductance exhibiting dependence with respect to the stress to be applied to the semiconductor substrate and is configured to output a second current based on the second transconductance and a first reference voltage and the divided voltage input to the second input portion;
- a transimpedance amplifier, to which the first current and the second current are to be input in a combined manner, and which is configured to output a voltage based on input currents; and
- the output portion configured to output the voltage output from the transimpedance amplifier to the output terminal, and wherein, when stress dependence coefficients with respect to the stress to be applied to the semiconductor substrate of the first transconductance, the second transconductance, and a first voltage dividing ratio determined by a ratio between a resistance value of the first resistor circuit and a resistance value of the second resistor circuit are represented by a first stress dependence coefficient, a second stress dependence coefficient, and a third stress dependence coefficient, respectively, a gain of the amplifier has a stress dependence coefficient approximated by a sum of a difference between the first stress dependence coefficient and the second stress dependence coefficient and the third stress dependence coefficient.

2. The semiconductor device according to claim 1, wherein the voltage divider circuit contains the second end connected to a node to which the first reference voltage is applied, and is configured to divide a voltage difference between the first and the second ends into a first divided voltage, and
wherein the second input portion is configured to input the first reference voltage in addition to the first divided voltage as the at least one voltage.

3. The semiconductor device according to claim 1, wherein the at least one output terminal containing a first output terminal configured to output a first output voltage to the external circuit and a second terminal configured to output a first output voltage to the external circuit,
wherein the output portion of the amplifier contains a first output port connected to the first output terminal and the second output port connected to the second terminal,
wherein the voltage divider circuit contains the first end connected to the first output port and the second end connected to the second port, and is configured to divide a voltage difference between the first and the second ends into a first divided voltage having the first voltage dividing ratio and a second divided voltage having a second voltage dividing ratio which is different from the first voltage dividing ratio, and which is determined by a ratio between a resistance value of the first resistor circuit and a resistance value of the second resistor circuit, and
wherein the second input portion is configured to input the first and divided voltages as the at least one voltage.

4. The semiconductor device according to claim 1, wherein the third stress dependence coefficient includes a first piezoelectric coefficient of the first resistor circuit and a second piezoelectric coefficient of the second resistor circuit, and
wherein at least one of the first resistor circuit or the second resistor circuit includes one resistor and another resistor that are connected to each other, the one resistor being arranged in a first direction parallel to a substrate surface of the semiconductor substrate, the another resistor being arranged in a second direction which is a direction parallel to the substrate surface and is orthogonal to the first direction.

5. The semiconductor device according to claim 1, wherein the physical quantity sensor element is any one element selected from the group consisting of a Hall element, a temperature sensor element, an optical sensor element, and a pressure sensor element.

6. The semiconductor device according to claim 1, wherein the transimpedance amplifier further includes at least one of a gate-grounded amplifier and a source-grounded amplifier.

7. The semiconductor device according to claim 1,
wherein the first resistor circuit includes at least one element selected from the group consisting of a diffused resistor of a first type which is one of an N type and a P type, a well resistor of the first type, a polysilicon resistor of the first type, and a field effect transistor of the first type, and
wherein the second resistor circuit includes at least one element selected from the group consisting of a diffused resistor of a second type which is another one of the N type and the P type, a well resistor of the second type, a polysilicon resistor of the second type, and a field effect transistor of the second type.

8. The semiconductor device according to claim 1,
wherein the output portion of the physical quantity sensor element includes at least a first output port and a second output port,
wherein the sensor output signal is a signal representing a voltage difference between a first sensor output voltage output from the first output port and a second sensor output voltage output from the second output port,
wherein the first transconductance amplifier includes a first field effect transistor and a second field effect transistor, and is configured to convert the voltage difference between the first sensor output voltage and the second sensor output voltage which are to be applied to the first field effect transistor and the second field effect transistor, respectively, into the first current, and
wherein the second transconductance amplifier includes a third field effect transistor and a fourth field effect transistor, and is configured to convert a voltage difference between the first divided voltage and the second divided voltage which are to be applied to the third field effect transistor and the fourth field effect transistor, respectively, into the second current.

9. The semiconductor device according to claim 8,
wherein the first transconductance amplifier further includes:
a first current source having one end connected to a source of the first field effect transistor;
a second current source having one end connected to a source of the second field effect transistor; and
a third resistor circuit configured to connect the one end of the first current source and the one end of the second current source to each other,
wherein the second transconductance amplifier further includes:
a third current source having one end connected to a source of the third field effect transistor;
a fourth current source having one end connected to a source of the fourth field effect transistor; and
a fourth resistor circuit configured to connect the one end of the third current source and the one end of the fourth current source to each other,
wherein the third resistor circuit and the fourth resistor circuit have a fourth stress dependence coefficient and a fifth stress dependence coefficient, respectively, with respect to the stress to be applied to the semiconductor substrate, and
wherein the fourth stress dependence coefficient and the fifth stress dependence coefficient are piezoelectric coefficients that are different from each other.

10. The semiconductor device according to claim 9, wherein at least one of the third resistor circuit or the fourth resistor circuit includes one resistor and another resistor that are connected to each other, the one resistor being arranged in a first direction parallel to a substrate surface of the semiconductor substrate, the another resistor being arranged in a second direction which is a direction parallel to the substrate surface and is orthogonal to the first direction.

11. The semiconductor device according to claim 8,
wherein the first transconductance amplifier further includes a first current source having one end connected to a connection point at which a source of the first field effect transistor and a source of the second field effect transistor are connected to each other,
wherein the second transconductance amplifier further includes a second current source having one end connected to a connection point at which a source of the third field effect transistor and a source of the fourth field effect transistor are connected to each other, and
wherein the first current source and the second current source have a fourth stress dependence coefficient and a fifth stress dependence coefficient, respectively, with respect to the stress to be applied to the semiconductor substrate.

12. The semiconductor device according to claim 11, further comprising:
an input terminal to which a second reference voltage is to be input;
a first voltage-current converter circuit including:
an input port connected to the input terminal;
a third resistor circuit having a sixth stress dependence coefficient with respect to the stress to be applied to the semiconductor substrate; and
an output port connected to the first current source; and
a second voltage-current converter circuit including:
an input port connected to the input terminal;
a fourth resistor circuit having a seventh stress dependence coefficient with respect to the stress to be applied to the semiconductor substrate; and
an output port connected to the second current source,
wherein the first voltage-current converter circuit is configured to output, from the output port, a first reference current corresponding to a ratio between the second reference voltage and a resistance value of the third resistor circuit,
wherein the second voltage-current converter circuit is configured to output, from the output port, a second reference current corresponding to a ratio between the second reference voltage and a resistance value of the fourth resistor circuit,
wherein the first current source is configured to cause a current proportional to the first reference current to flow,
wherein the second current source is configured to cause a current proportional to the second reference current to flow, and
wherein the sixth stress dependence coefficient and the seventh stress dependence coefficient are piezoelectric coefficients that are different from each other.

13. The semiconductor device according to claim 12,
wherein the first voltage-current converter circuit further includes:
a first operational amplifier; and
a fifth field effect transistor connected to an output port of the first operational amplifier and to a second power supply terminal via the third resistor circuit,
wherein the first operational amplifier includes a non-inverting input port connected to the input terminal, and an inverting input port connected to a connection point at which the fifth field effect transistor and one end of the third resistor circuit are connected to each other,
wherein the third resistor circuit includes another end connected to the second power supply terminal,
wherein the second voltage-current converter circuit further includes:
a second operational amplifier; and
a sixth field effect transistor connected to an output port of the second operational amplifier and to the second power supply terminal via the fourth resistor circuit,
wherein the second operational amplifier includes a non-inverting input port connected to the input terminal, and an inverting input port connected to a connection point at which the sixth field effect transistor and one end of the fourth resistor circuit are connected to each other,
wherein the fourth resistor circuit includes another end connected to the second power supply terminal,
wherein the first reference current is set to be proportional to a drain current of the fifth field effect transistor, and
wherein the second reference current is set to be proportional to a drain current of the sixth field effect transistor.

14. The semiconductor device according to claim 12, wherein at least one of the third resistor circuit and the fourth resistor circuit includes a first resistor arranged in a first direction parallel to a substrate surface of the semiconductor substrate, and a second resistor arranged in a second direction which is a direction parallel to the substrate surface and is orthogonal to the first direction, the second resistor being connected to the first resistor.

15. The semiconductor device according to claim 12,
wherein the third resistor circuit includes at least one element selected from the group consisting of a diffused resistor of a first type which is one of an N type and a P type, a well resistor of the first type, a polysilicon resistor of the first type, and a field effect transistor of the first type, and wherein the fourth resistor circuit includes at least one element selected from the group consisting of a diffused resistor of a second type which is another one of the N type and the P type, a well resistor of the second type, a polysilicon resistor of the second type, and a field effect transistor of the second type.

* * * * *